United States Patent [19]
Shimotori et al.

[11] Patent Number: 4,891,066
[45] Date of Patent: Jan. 2, 1990

[54] HIGHLY PURE TITANIUM

[75] Inventors: Kazumi Shimotori, Kawasaki; Yoshiharu Ochi, Ichihara; Hideo Ishihara; Takenori Umeki, both of Yokohama; Takashi Ishigami, Chigasaki, all of Japan

[73] Assignee: Kabushiki Kaisha Toshiba, Kawasaki, Japan

[21] Appl. No.: 219,799

[22] Filed: Jul. 15, 1988

Related U.S. Application Data

[62] Division of Ser. No. 51,772, May 20, 1987, Pat. No. 4,793,854.

[30] Foreign Application Priority Data

May 30, 1986 [JP] Japan ................................. 61-123463

[51] Int. Cl.$^4$ ............................................. C22B 34/12
[52] U.S. Cl. ......................................... 75/84; 75/10.19
[58] Field of Search ..................... 75/84, 10.19, 10.24, 75/10.25

[56] References Cited

U.S. PATENT DOCUMENTS

| | | | |
|---|---|---|---|
| 2,698,267 | 12/1954 | Halversen | 75/84 |
| 2,777,763 | 1/1957 | Whaley | 75/84 |
| 2,813,921 | 11/1957 | Vordahl | 75/84 |
| 2,977,219 | 3/1961 | Chapin | 75/84 |
| 3,406,056 | 10/1968 | Albert | 75/84 |
| 3,784,593 | 1/1974 | Taylor | 75/84 |
| 3,948,637 | 4/1976 | Taylor | 75/84 |
| 4,111,686 | 9/1978 | Paris | 75/84 |

*Primary Examiner*—Peter D. Rosenberg
*Attorney, Agent, or Firm*—Foley & Lardner, Schwartz, Jeffery, Schwaab, Mack, Blumenthal & Evans

[57] ABSTRACT

Disclosed is a highly pure titanium which comprises containing not more than 200 ppm of oxygen; not more than 30 ppm each of elements consisting of iron, nickel and chromium, and not more than 0.1 ppm each of elements consisting of sodium and potassium.

Disclosed is also a process for preparing the above highly pure titanium which comprises melting a crude titanium obtained by molten salt electrolysis, in a high vacuum of $5 \times 10^{-5}$ mbar or less.

8 Claims, 2 Drawing Sheets

HIGHLY PURE TITANIUM

This application is a division of application Ser. No. 051,772, filed May 20, 1987, now U.S. Pat. No. 4,793,854.

BACKGROUND OF THE INVENTION

This invention relates to a titanium (or a titanium material) having high purity, and, more particularly, a highly pure titanium useful as a material for use in forming a wiring network on the surface of a semiconductor device.

On the surface of semiconductor devices, a wiring network complexly patterned for a certain use is formed by use of a conductive metallic material. In general, to form such a wiring network, a thin film of conductive metal such as polysilicon (a-Si), Al, Au and so forth is first formed on the surface of a semiconductor device by applying a sputtering method, and thereafter the thin film is treated by etching to remove portions other than the desired wiring circuits to give a wiring network remaining on the surface.

Recently, devices have been made increasingly light, thin, short and small in size, and, as a result, an effort is made to densely form the wiring network, namely, to make the width of a circuit narrower or the thickness of a circuit thinner.

With increase in integration of semiconductor device like this, there is always caused a problem that a signal delay is caused by wiring-resistance of a wiring material used, or a problem that the material is melted by the resistance heat generated in the wiring network of an actuated device when the material comprises a low-melting material.

For these reasons, there are strong demands for wiring materials that are high-melting and low-resistant at the same time, and also do not require any modification of the process in the production of LSI, VLSI or ULSI, and Ti, comparable to Mo and Ta, has attracted notice as such material.

On the other hand, a sputtering method is chiefly employed in the step of forming a conductive metallic thin film, which is a step preliminary for the formation of wiring networks on the surface of semiconductor devices.

This is a method in which certain ion species are injected into a target comprised of a constituent material for a thin film to be formed on the surface of a semiconductor device, so that the target-constituting material may be ejected to be adhered on the surface of the semiconductor device.

In applying this sputtering method, it is necessary to prepare the sputtering target with use of the metallic material mentioned above.

Namely, a titanium material is used as the target when a wiring network comprising Ti is to be formed. Here, it is essential for the titanium material to be highly pure.

This is because, when, for example, oxygen is contained in the titanium material as an impurity even in a very small amount, the titanium material itself may become brittle causing an increase in the electric resistance of the thin film formed, whereby accidents such as melt-break of wiring networks may frequently occur; in the case of heavy metals such as Fe, Ni and Cr, they may constitute a cause of a leak at the interfacial joint between VLSI or the like and the thin film formed; or, in the case of alkali metals such as Na and K, they may be readily diffused and migrated in an insulating film provided on the VLSI or the like to deteriorate properties of the device. Also, U or Th, radiating alpha rays, may damage the device, resulting in extreme lowering of the operational reliability of the device.

At present, the following three processes are widely used as the process for producing the titanium material.

The first is a process in which a titanium compound such as $TiCl_4$ is subjected to thermal reduction by using active metals such as Na, K and Mg, and is called the Kroll process or Hunter process. The second process is a process in which the titanium compound such as $TiCl_4$ is subjected to thermal decomposition, and is called an iodide process. The third process is a process in which a $TiO_2$-NaF-KF mixture or a $CaCl_2$-$TiO_2$ mixture is subjected to molten salt electrolysis.

In general, the titanium material thus produced, which usually has a spongy or acicular shape, is, for example, melted by arcs in a vacuum of $1.3 \times 10^{-2}$ to $1.3 \times 10^{-3}$ mbar to be formed into an ingot, which is used as a target material.

However, the titanium materials produced by the conventional processes mentioned above have a purity of only about 99% to 99.9%, which can be used as sputter target to be used in 64K bit devices, but are not suitable as wiring materials when used in 256 K bit, 1 M bit or 4M bit devices.

In other words, as mentioned above, the less impurities a titanium material has, the more desirable it is as a wiring material. For example, taking account of a wiring material for an LSI of 4M bits or more, it is found that oxygen must be not more than 200 ppm; heavy metals, not more than 30 ppm; and alkali metals, not more than 0.1 ppm. However, it is very difficult according to the above conventional industrial processes to produce a titanium having such a high purity.

SUMMARY OF THE INVENTION

An object of this invention is to provide a titanium that can solve the above problems involved in titanium used as wiring materials for LSI, and has very small content of impurity elements which may adversely affect the performances of a device, and yet can be produced with ease in an industrial scale.

To achieve the above object, the present inventors have made intensive studies on the aforesaid respective production processes. As a result, it was found that, when a spongy or acicular titanium obtained from an ore is melted by arcs and casted, only oxygen content may increase in the resulting ingot even if the titanium has a high purity. Specifically speaking, it increased in amount of 200 to 300 ppm per one time of arc melting. Based on this new finding, they have made further studies to find that an acicular titanium, prepared by a molten salt electrolysis, may be melted to form an ingot in a high vacuum of $5 \times 10^{-5}$ mbar or less according to an electron beam melting method (EB method) in place of the arc melting method, whereby the resulting ingot can be made to have very small contents of oxygen, heavy metals (such as Fe, Ni and Cr), alkali metals (such as Na and K) mentioned above, and can be useful as a wiring material for LSI, VLSI or ULSI. Thus, the highly pure titanium of this invention has been created.

Accordingly, the highly pure titanium of this invention is characterized by containing not more than 200 ppm of oxygen; not more than 30 ppm each of elements consisting of iron, nickel and chromium, and not more than 0.1 ppm each of elements consisting of sodium and potassium, and also characterized as a titanium feasible for mass production in an industrial scale. The process for producing the same is characterized by subjecting a crude titanium obtained by a molten salt electrolysis to electron beam melting.

DESCRIPTION OF PREFERRED EMBODIMENTS

Figure 1:
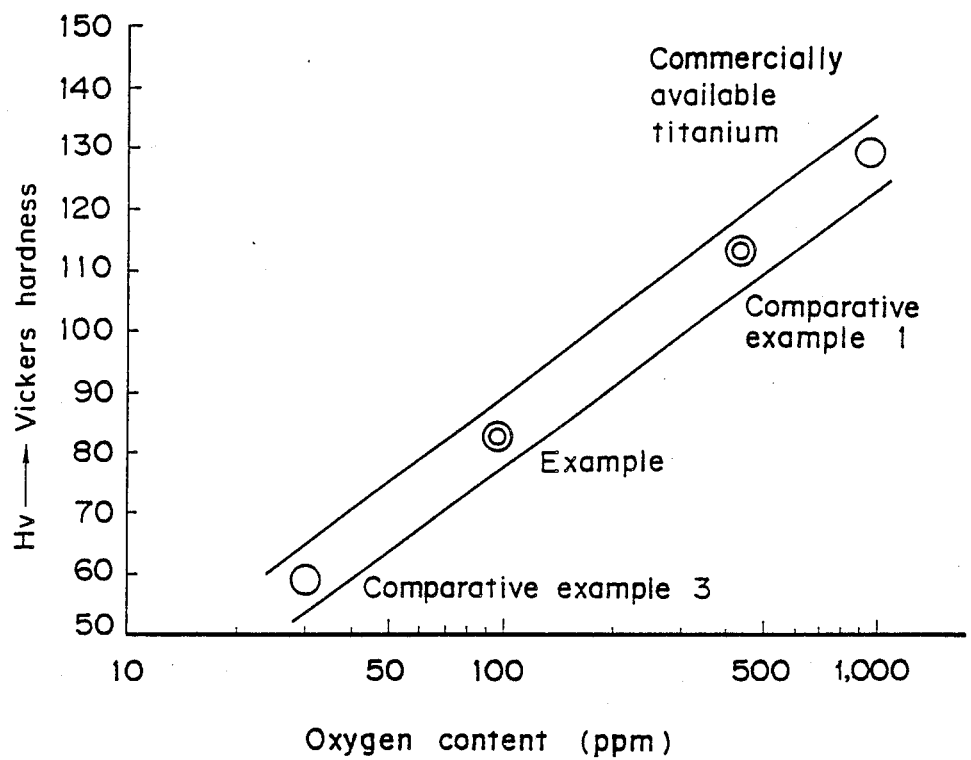
FIG. 1 shows the relationship between oxygen content (ppm) and Vickers hardness (Hv) of each titanium material.

The titanium material of this invention can be produced in the following manner.

First of all, an acicular titanium is produced by a molten salt electrolysis. For example, $K_2TiF_6$ may be used as a starting titanium, and $TiO_2$ having smaller content of U and Th is preferably used. The electrolysis may be preferably carried out using an electrolytic bath comprising a $K_2TiF_6$-NaCl solution, at a temperature of 730° to 755° C. and under avoltage of 6.0 to 8.0 V.

The molten salt electrolysis carried out under the conditions set out above can produce an acicular titanium usually containing 100 to 160 ppm of oxygen; 0.75 to 6 ppm each of Fe, Cr and Ni; and 96 to 325 ppm each of Na and K.

The resulting acicular titanium may be fed into an electron beam melting furnace while preventing external contamination. It can be contemplated that the acicular titanium obtained by the above molten salt electrolysis is usually pressed into a compact body, which is used as an electrode to carry out the electron beam melting. Since, however, in such an instance, contamination occurs due to tools and deformation caused in the formation of the compact body, it is required in this invention to feed the acicular titanium as it is in a vacuum by a granule feeder with vibration system, followed by the electron beam melting.

In the electron beam melting furnace, electron beam melting of the acicular titanium may be carried out while keeping the inside of the furnace in a vacuum of $5 \times 10^{-5}$ mbar or less, preferably of $2 \times 10^{-5}$ mbar or less and using a Freon baffle to prevent diffusion pump oil from being mixed into the furnace.

There is no particular limitation in the operation conditions in the electron beam melting, but the melting rate is required to be selected taking account of the effect of purification of Na and K or the absorption of contamination by oxygen. For example, a preferable condition is such that the melting rate is set to 1.75 to 2.3 kg/hr.

In the course of this step, the problem of increase in oxygen content that may occur when the usual arc melting method is used can be eliminated by great improvement in the evacuating ability, and, in the resulting electron beam cast material, oxygen can be controlled to be kept at 200 ppm or less with large decreases in Na and K, and other impurity elements also can be decreased and by no means increased.

This invention will be described in greater detail by the following Example.

EXAMPLE

Molten salt electrolysis was carried out using an electrolytic bath comprising $K_2TiF_6$-NaCl (weight ratio: $K_2TiF_2$, 16%; NaCl, 84%), at electrolytic temperature of 755° C., current of 200 A and voltage of 8.0 V to produce an acicular titanium containing 100 to 160 ppm of oxygen, 10 ppm or less of Fe, 18 ppm or less of Cr, about 1 ppm of Ni, about 325 ppm of Na and about 175 ppm of K. This titanium material was inserted into a granule feeder as it was, which was then thrown into an electron beam melting furnace under vibration while preventing external contamination in a vacuum. Electron beam melting was carried out while keeping the inside of the furnace in a high vacuum of $5 \times 10^{-5}$ mbar and using a Freon baffle to prevent diffusion pump oil from being mixed into the furnace, and under the conditions of 20 Kv, filament current of 1.3 to 1.5 A, EB output of 26 to 30 KW and melting rate of 2 kg/hr, to obtain an ingot of 80 mm in diameter.

The resulting ingot was examined by elementary analysis to obtain the results as shown in the table.

A similar titanium material was cast according to arc melting in a vacuum of $8 \times 10^{-4}$ mbar to produce an ingot (Comparative Example 1). Results of elementary analysis on this ingot are also shown together. A spongy titanium obtained by reducing titanium tetrachloride ($TiCl_4$) with magnesium, namely, a crude titanium produced by Kroll method, was subjected to arc melting to obtain a titanium material, which was examined by similar analysis to obtain the results shown in the table as Comparative Example 2.

Further, titanium tetraiodide ($TiI_4$) was subjected to thermal decomposition to obtain a crystal titanium, and similar analysis was carried out by using it to obtain the results shown in the table as Comparative Example 3.

TABLE

| Sorts of impurities | Example (ppm) | Comparative example 1 (ppm) | Comparative example 2 (ppm) | Comparative example 3 (ppm) |
|---|---|---|---|---|
| O | 100 to 150 | 200 to 300 | 400 | 20 to 100 |
| Fe | 0.4 to 0.8 | 3 to 5 | 50 | 20 |
| Cr | 0.3 to 0.5 | 3 to 6 | 10 | 15 |
| Ni | 0.1 to 0.3 | 0.75 | 50 | 20 |
| Na | 0.05 | 0.7 | 0.05 | 10 |
| K | 0.05 | 0.5 | 0.05 | 10 |
| U | <0.001* | <0.001* | <0.001* | <0.001* |
| Th | <0.001* | <0.001* | <0.001* | <0.001* |

*A value of not more than 0.001 ppm was not detectable.

For reference, the hardness of the surface (Vickers hardness: Hv) was measured on each of the titanium of Example, the titanium of Comparative Example 1 and the titanium of Comparative Example 3 and a commercially available titanium (oxygen content: about 1,000 ppm) to show in FIG. 1 the relationship between each value obtained and oxygen content. As will be clear from the table, the titanium according to this invention has softness necessary as a wiring material for use in LSI, VLSI, ULSI, etc.

Figure 2:
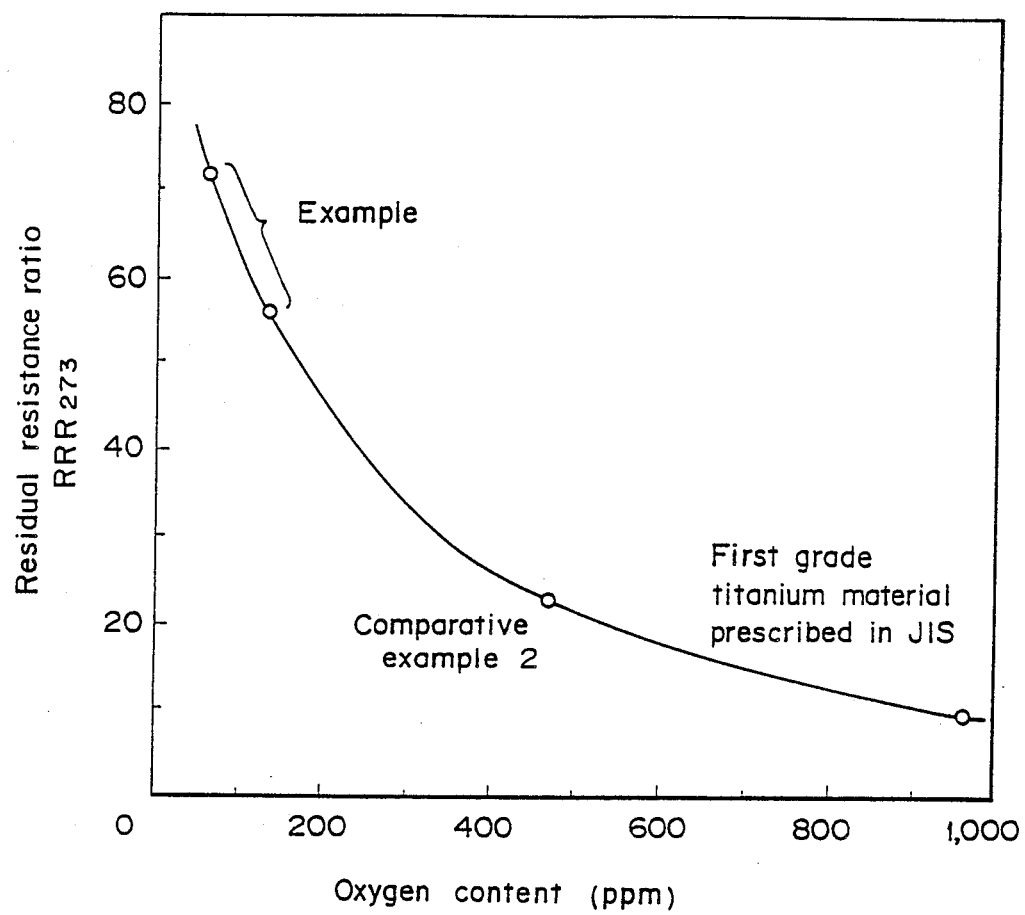
FIG. 2 shows the relationship between impurity content, particularly oxygen content (ppm) to be most questioned, and residual resistance ratio $RRR_{273}$.

As a value that can further show an excellent performance of the highly pure titanium of this invention, reference can be made on residual resistance ratio $RRR_{273}$. Cooling a metal to a low temperature, electric resistance due to thermal vibration may disappear to make resistance zero in nature, but resistance $\rho_0$ may remain because of the presence of impurities or the like. This is residual resistance, showing that the greater the ratio to $\rho_{273}$ at $T=273°$ K., i.e., $RRR_{273} = \rho_{273}/\rho_0$ is, the less the residual resistance is to have a higher purity. In this invention, tests were carried out to examine the relationship in these by use of titanium materials obtained in Example 2 and Comparative example 2 and a first grade titanium material (JIS H46TP28) prescribed in JIS (Japanese Industrial Standard) H2152, to find that the highly pure titanium of this invention shows an excellent value of $RRR_{273} \geqq 45$. This relationship is shown in FIG. 2.

Before electron beam melting, degassing was further carried out on the starting material in a vacuum of $1.3 \times 10^{-4}$ mbar or more and at 1000° C. or more, whereby the yield increased greatly.

As will be clear from the above results, the titanium material of this invention has very small content of undesirable impurity elements when viewed as a wiring material for LSI, VLSI or ULSI. The process for producing the same is also industrially very useful, and can be said to be useful as compared with a case where the iodide method using a material of relatively smaller impurity content is a process yielding lower productivity.

We claim:

1. A highly pure titanium comprising not more than 200 ppm of oxygen; not more than 30 ppm each of elements consisting of iron, nickel and chromium, and not more than 0.1 ppm each of elements consisting of sodium and potassium, wherein said highly pure titanium has a residual resistance ratio $RRR_{273}$ of 45 or more.

2. The highly pure titanium according to claim 1, wherein said highly pure titanium comprises not more than 0.001 ppm each of uranium and thorium.

3. A highly pure titanium according to claim 1, comprising not more than 150 ppm oxygen.

4. A highly pure titanium according to claim 1, comprising not more than 0.05 ppm each of sodium and potassium.

5. A highly pure titanium according to claim 1, comprising not more than 0.8 ppm each of the elements iron, nickel and chromium.

6. A highly pure titanium according to claim 3, comprising not more than 0.05 ppm each of sodium and potassium.

7. A highly pure titanium according to claim 6, comprising not more than 0.8 ppm each of the elements iron, nickel and chromium.

8. A highly pure titanium according to claim 7, comprising not more than 0.001 ppm each of uranium and thorium.

* * * * *